(12) United States Patent
Hendrix et al.

(10) Patent No.: US 12,808,036 B2
(45) Date of Patent: Nov. 24, 2026

(54) FORMING FILMS WITH IMPROVED STEP COVERAGE

(71) Applicant: ENTEGRIS, INC., Billerica, MA (US)

(72) Inventors: Bryan C. Hendrix, Danbury, CT (US); Lucas B. Henderson, Danbury, CT (US); Eric Condo, Shelton, CT (US); Philip S. H. Chen, Bethel, CT (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 18/819,824

(22) Filed: Aug. 29, 2024

(65) Prior Publication Data

US 2025/0075314 A1 Mar. 6, 2025

Related U.S. Application Data

(60) Provisional application No. 63/656,991, filed on Jun. 6, 2024, provisional application No. 63/535,287, filed on Aug. 29, 2023.

(51) Int. Cl.

| | |
|---|---|
| ***C23C 16/04*** | (2006.01) |
| ***C23C 16/40*** | (2006.01) |
| ***C23C 16/455*** | (2006.01) |

(52) U.S. Cl.

CPC ............ *C23C 16/045* (2013.01); *C23C 16/40* (2013.01); *C23C 16/45553* (2013.01)

(58) Field of Classification Search

None

See application file for complete search history.

(56) References Cited

U.S. PATENT DOCUMENTS

| | | | | |
|---|---|---|---|---|
| 8,802,201 | B2 | 8/2014 | Raisanen et al. | |
| 8,883,270 | B2 | 11/2014 | Shero et al. | |
| 2004/0002224 | A1 | 1/2004 | Chono et al. | |
| 2015/0217330 | A1 | 8/2015 | Haukka | |
| 2019/0348273 | A1 | 11/2019 | Tang et al. | |
| 2021/0017339 | A1 | 1/2021 | Xiao et al. | |
| 2021/0384035 | A1* | 12/2021 | Fisher | C23C 16/14 |
| 2022/0081769 | A1 | 3/2022 | Chaney et al. | |

(Continued)

FOREIGN PATENT DOCUMENTS

| | | | |
|---|---|---|---|
| CN | 109716508 | A | 5/2019 |
| KR | 20040087468 | A | 10/2004 |
| KR | 20110031132 | A | 3/2011 |

(Continued)

OTHER PUBLICATIONS

Annelies Delabie et al., Ozone Based Atomic Layer Deposition of Hafnium Oxide and Impact of Nitrogen Oxide Species, Journal of the Electrochemical Society, 158, 5, D259-D263, 2011.

(Continued)

*Primary Examiner* — Shamim Ahmed
*Assistant Examiner* — Bradford M Gates

(57) ABSTRACT

A device is provided. The device comprises a substrate having at least one structure with an aspect ratio of at least 10:1. The device comprises a film located on the at least one structure with a step coverage of at least 90%. The film comprises a metal oxide or metalloid oxide; and a concentration of less than $1\times10^{20}$ hydrogen atoms per cubic centimeter as measured by SIMS. Methods for forming films on substrates and related systems and methods are also provided herein.

12 Claims, 2 Drawing Sheets

(56) References Cited

U.S. PATENT DOCUMENTS

| | | | |
|---|---|---|---|
| 2022/0119939 A1 | 4/2022 | Noh et al. | |

FOREIGN PATENT DOCUMENTS

| | | | |
|---|---|---|---|
| TW | 202210653 | A | 3/2022 |
| TW | 202235662 | A | 9/2022 |
| TW | 202330979 | A | 8/2023 |
| WO | 2006081234 | A2 | 8/2006 |

OTHER PUBLICATIONS

Kaupo Kukli et al., Atomic layer deposition of zirconium dioxide from zirconium tetrachloride and ozone, Thin Solid Films, 589, 597-604, 2015.

* cited by examiner

FORMING FILMS WITH IMPROVED STEP COVERAGE

CROSS-REFERENCE TO RELATED APPLICATIONS

This application claims the benefit under 35 USC 119 of U.S. Provisional Patent Application Nos. 63/535,287, filed Aug. 29, 2023, and 63/656,991 filed on Jun. 6, 2024, the disclosure of each is hereby incorporated herein by reference in its entirety.

FIELD

The present disclosure relates to forming films with improved step coverage, related devices, related systems, and related methods.

BACKGROUND

Films deposited via vapor deposition processes can result in non-uniform films. Problems associated with self-decomposition of the metal precursor source and insufficient diffusion, or dosage of the metal precursor source can result in non-uniform film deposition. In a similar manner, co-reactants can have associated problems with decomposition on the film surfaces, insufficient diffusion, insufficient dosage, or any combination thereof.

SUMMARY

Some embodiments of the present disclosure relate to a method. In some embodiments, the method is a method for forming a film. In some embodiments, the method comprises exposing a substrate having at least one structure with an aspect ratio of at least 10:1, to a first precursor gas. In some embodiments, the method comprises flowing a feed gas comprising at least 1% by volume of $N_2$ based on a total volume of the feed gas, to an ozone generator to produce a second precursor gas. In some embodiments, the method comprises exposing the substrate to the second precursor gas to form, on the at least one structure of the substrate, a film having a step coverage of at least 90%.

Some embodiments of the present disclosure relate to a device. In some embodiments, the device comprises a substrate. In some embodiments, the substrate has at least one structure with an aspect ratio of at least 10:1. In some embodiments, the device comprises a film. In some embodiments, the film is located on the at least one structure with a step coverage of at least 90%. In some embodiments, the film comprises a metal oxide. In some embodiments, the film comprises a concentration of less than $1\times10^{20}$ hydrogen atoms per cubic centimeter as measured by SIMS.

DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Figure 1:
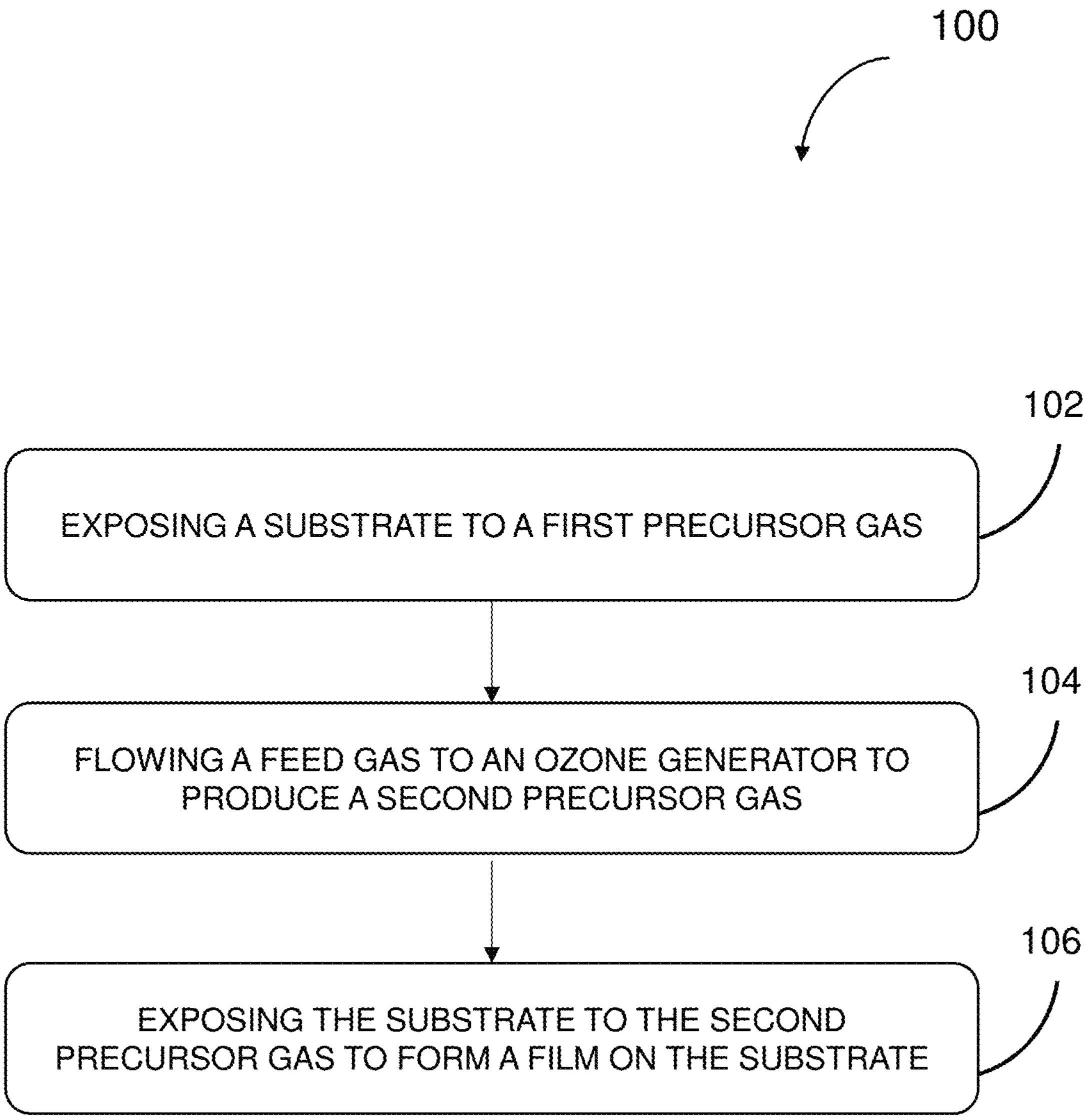
FIG. 1 is a flowchart of a method for forming a film, according to some embodiments.

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Any prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Some embodiments relate to methods for forming films on substrates with improved step coverage and related systems and devices, among other things. Some film deposition processes have unpredictably poor step coverage. As disclosed herein, it has been discovered that increasing the concentration of nitrogen ($N_2$) in a precursor gas above conventional levels of 10 ppm to 15 ppm unexpectedly results in improvements in step coverage, when the precursor gas comprising the $N_2$ is a feed gas supplied to an ozone generator and the resulting gas from the ozone generator (e.g., corona plasma) is used in a vapor deposition process. Accordingly, in some embodiments, methods for forming films (e.g., metal oxide films) on at least one high aspect ratio structure of a substrate with a step coverage of at least 90% are provided, along with related systems, devices, and methods.

Examples of vapor deposition processes include, without limitation, at least one of a chemical vapor deposition (CVD) process, a digital or pulsed chemical vapor deposition process, a plasma-enhanced cyclical chemical vapor deposition process (PECCVD), a flowable chemical vapor deposition process (FCVD), an atomic layer deposition (ALD) process, a thermal atomic layer deposition, a plasma-enhanced atomic layer deposition (PEALD) process, a metal organic chemical vapor deposition (MOCVD) process, a plasma-enhanced chemical vapor deposition (PECVD) process, or any combination thereof.

As used herein, the term "step coverage" refers to a ratio of a thickness of a film on a first surface of a substrate to a thickness of the film on a second surface of the substrate. In some embodiments, the first surface of the substrate and the second surface of the substrate are different. For example, in some embodiments, the first surface of the substrate is a surface at the bottom of a high aspect ratio structure (e.g., a trench) and the second surface of the substrate is a surface at the top of the high aspect ratio structure (e.g., a trench). As disclosed herein, non-limiting examples of high aspect ratio structures include, for example and without limitation, at least one of a trench, a plenum, a cavity, a hole, a channel, or any combination thereof. It will be appreciated that other structures would have high aspect ratios and thus these shall not be limiting.

FIG. 1 is a flowchart of a method 100 for forming a film, according to some embodiments. As shown in FIG. 1, the method 100 for forming a film may comprise one or more of the following steps: exposing 102 a substrate to a first precursor gas; flowing 104 a feed gas to an ozone generator to produce a second precursor gas; and exposing 106 the substrate to the second precursor gas to form a film on the substrate. In some embodiments, performing one or more of the steps 102, 104, and 106 comprises a deposition cycle. In some embodiments, the method 100 for forming a film comprises 1 deposition cycle to 100,000 deposition cycles, or any range or subrange between 1 deposition cycle and 100,000 deposition cycles.

In some embodiments, the method 100 for forming a film comprises exposing 102 a substrate to a first precursor gas. In some embodiments, the exposing 102 comprises introducing the first precursor gas into a chamber containing the substrate. In some embodiments, the exposing 102 comprises flowing the first precursor gas into a chamber containing the substrate. In some embodiments, the exposing 102 comprises supplying the first precursor gas to a chamber containing the substrate. In some embodiments, the exposing 102 comprises pumping the first precursor gas into a chamber containing the substrate. In some embodiments, the exposing 102 comprises pulsing the first precursor gas into a chamber containing the substrate. In some embodiments, the exposing 102 comprises pulsing the first precursor gas into a chamber containing the substrate for a duration. In some embodiments, the exposing 102 is sufficient to bring the first precursor gas and the substrate into immediate or close proximity, or direct physical contact.

In some embodiments, the exposing 102 comprises pulsing the first precursor gas into a chamber containing the substrate for a duration. In some embodiments, the duration is a duration of 0.01 seconds to 60 minutes, or longer, or any range or subrange between 0.01 seconds and 60 minutes. For example, in some embodiments, the duration is a duration of 0.01 seconds to 50 minutes, 0.01 seconds to 40 minutes, 0.01 seconds to 30 minutes, 0.01 seconds to 20 minutes, 0.01 seconds to 10 minutes, 0.01 seconds to 1 minute, 0.01 seconds to 45 seconds, 0.01 seconds to 30 seconds, 0.01 seconds to 15 seconds, 0.01 seconds to 10 seconds, 0.01 seconds to 5 seconds, 0.01 seconds to 3 seconds, 0.01 seconds to 1 seconds, 0.01 seconds to 0.5 seconds, 0.01 seconds to 0.1 seconds, or 0.01 seconds to 0.05 seconds. In some embodiments, the duration is a duration of 0.05 seconds to 60 minutes, 0.10 seconds to 60 minutes, 0.2 seconds to 60 minutes, 0.3 seconds to 60 minutes, 0.4 seconds to 60 minutes, 0.5 seconds to 60 minutes, 0.6 seconds to 60 minutes, 0.7 seconds to 60 minutes, 0.8 seconds to 60 minutes, 0.9 seconds to 60 minutes, 1 seconds to 60 minutes, 3 seconds to 60 minutes, 5 seconds to 60 minutes, 15 seconds to 60 minutes, 30 seconds to 60 minutes, 1 minute to 60 minutes, 10 minutes to 60 minutes, 20 minutes to 60 minutes, 30 minutes to 60 minutes, 40 minutes to 60 minutes, or 50 minutes to 60 minutes.

In some embodiments, the duration is a duration of 0.01 seconds to 5 minutes, or longer, or any range or subrange between 0.01 seconds and 5 minutes. For example, in some embodiments, the duration is a duration of 0.01 seconds to 4 minutes, 0.01 seconds to 3 minutes, 0.01 seconds to 2 minutes, 0.01 seconds to 2 minutes, 0.01 seconds to 1 minute, 0.01 seconds to 50 seconds, 0.01 seconds to 40 seconds, 0.01 seconds to 30 seconds, 0.01 seconds to 20 seconds, 0.01 seconds to 10 seconds, 0.01 seconds to 5 seconds, or 0.01 seconds to 3 seconds, 0.01 seconds to 1 seconds, 0.01 seconds to 0.5 seconds, 0.01 seconds to 0.1 seconds, or 0.01 seconds to 0.05 seconds. In some embodiments, the duration is a duration of 0.05 seconds to 5 minutes, 0.05 seconds to 5 minutes, 0.10 seconds to 5 minutes, 0.2 seconds to 5 minutes, 0.3 seconds to 5 minutes, 0.4 seconds to 5 minutes, 0.5 seconds to 5 minutes, 0.6 seconds to 5 minutes, 0.7 seconds to 5 minutes, 0.8 seconds to 5 minutes, 0.9 seconds to 5 minutes, 1 seconds to 5 minutes, 3 seconds to 5 minutes, 5 seconds to 5 minutes, 15 seconds to 5 minutes, 30 seconds to 5 minutes, 1 minute to 5 minutes, 2 minutes to 5 minutes, 3 minutes to 5 minutes, or 4 minutes to 5 minutes.

In some embodiments, the exposing 102 is performed at a temperature of 100° C. to 500° C., or any range or subrange between 100° C. and 500° C. For example, in some embodiments, the exposing 102 is performed at a temperature of 100° C. to 475° C., 100° C. to 450° C., 100° C. to 425° C., 100° C. to 400° C., 100° C. to 375° C., 100° C. to 350° C., 100° C. to 325° C., 100° C. to 300° C., 100° C. to 275° C., 100° C. to 250° C., 100° C. to 225° C., 100° C. to 200° C., 100° C. to 175° C., 100° C. to 150° C., 100° C. to 125° C., 125° C. to 500° C., 150° C. to 500° C., 175° C. to 500° C., 200° C. to 500° C., 225° C. to 500° C., 250° C. to 500° C., 275° C. to 500° C., 300° C. to 500° C., 325° C. to 500° C., 350° C. to 500° C., 375° C. to 500° C., 400° C. to 500° C., 425° C. to 500° C., 450° C. to 500° C., or 475° C. to 500° C.

In some embodiments, the substrate is a high-aspect ratio substrate. For example, in some embodiments, a high-aspect ratio substrate comprises a substrate having at least one structure with a high aspect ratio. In some embodiments, the substrate can have a plurality of structures, wherein each of the plurality of structures has a high aspect ratio. The number of structures having a high aspect ratio is not particularly limited and can range from one structure to thousands of structures. The at least one structure is not particularly limited and can include any structure having a high aspect ratio as disclosed herein. In some embodiments, the at least one structure comprises at least one of a trench, a plenum, a cavity, a hole, a channel, or any combination thereof. Although high-aspect ratio structures are disclosed herein, it will be appreciated that embodiments disclosed herein also include substrates without high-aspect ratio structures.

The aspect ratio of the structure can refer to a ratio of two of a width, a depth, a height, a length, or a diameter, in any combination. In some embodiments, for example, the aspect ratio refers to the ratio of a depth of a circular hole (e.g., a pore, etc.) to a diameter of the circular hole (e.g., the pore, etc.). In some embodiments, the aspect ratio refers to the ratio of a depth of a non-circular hole (e.g., a trench, etc.) to a width of the non-circular hole (e.g., the trench, etc.). Non-limiting examples of substrates, including high-aspect ratio substrates, include, without limitation, at least one of a membrane, a showerhead, a liner, a tube, a gas line, a valve, an injector, a tray, or any combination thereof.

The at least one structure on the substrate may be a structure having an aspect ratio of at least 10:1. For example, in some embodiments, the substrate has at least one structure with an aspect ratio of at least 10:1, at least 20:1, at least 30:1, at least 40:1, at least 50:1, at least 60:1, at least 70:1, at least 80:1, or at least 90:1. In some embodiments, the substrate has at least one structure with an aspect ratio of 10:1 to 100:1, 10:1 to 90:1, 10:1 to 80:1, 10:1 to 70:1, 10:1 to 60:1, 10:1 to 50:1, 10:1 to 40:1, 10:1 to 30:1, 10:1 to 20:1, 20:1 to 100:1, 30:1 to 100:1, 40:1 to 100:1, 50:1 to 100:1, 60:1 to 100:1, 70:1 to 100:1, 80:1 to 100:1, or 90:1 to 100:1. In some embodiments, the at least one structure and the substrate are a single unitary piece. In some embodiments, the at least one structure and the substrate are separately manufactured and assembled together.

The substrate may comprise a substrate useful for microelectronic applications and/or semiconductor applications. In some embodiments, the substrate comprises at least one of a silicon, a silicon oxide, a silicon on insulator (SOI), a carbon doped silicon oxide, a silicon nitride, a doped silicon, a germanium, a gallium arsenide, a glass, a sapphire, a metal, a metal nitride, a metal alloy, or any combination thereof. In some embodiments, the substrate comprises a semiconductor. In some embodiments, the substrate comprises at least one of titanium, titanium nitride, tungsten, tungsten nitride, tantalum, tantalum nitride, or any combination thereof.

The first precursor gas comprises at least one of an elemental metal, a metal halide, a metal oxyhalide, an organometallic compound, a metalorganic complex, or any combination thereof. In some embodiments, the first precursor gas comprises at least one of comprises at least one of $HfCl_4$, $ZrCl_4$, $AlCl_3$, $TiCl_4$, $TaCl_5$, $NbCl_5$, $VCl_4$, $GaCl_3$, $InCl_3$, or any combination thereof. In some embodiments, the first precursor gas comprises at least one of dimethyl hydrazine, trimethyl aluminum (TMA), hafnium chloride ($HfCl_4$), zirconium chloride ($ZrCl_4$), indium trichloride, indium monochloride, aluminum trichloride, titanium iodide, tungsten carbonyl, $Ba(DPM)_2$, bis dipivaloyl methanato strontium ($Sr(DPM)_2$), $TiO(DPM)_2$, tetra dipivaloyl methanato zirconium ($Zr(DPM)_4$), decaborane, octadecaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide ($Zr(t\text{-}OBu)_4$), tetrakisdiethylaminozirconium ($Zr(Net_2)_4$), tetrakisdiethylaminohafnium ($Hf(Net_2)_4$), tetrakis (dimethylamino) titanium (TDMAT), tertbutyliminotris (diethylamino) tantalum (TBTDET), pentakis (dimethylamino) tantalum (PDMAT), pentakis (ethylmethylamino) tantalum (PEMAT), tetrakisdimethylaminozirconium ($Zr(NMe_2)_4$), hafniumtertiarybutoxide ($Hf(tOBu)_4$), xenon difluoride ($XeF_2$), xenon tetrafluoride ($XeF_4$), xenon hexafluoride ($XeF_6$), or any combination thereof.

In some embodiments, the first precursor gas comprises at least one of a rare earth betadiketonate compound (e.g., ($La(THD)_3$) and/or ($Y(THD)_3$)), a rare earth cyclopentadienyl (Cp) compound (e.g., $La(iPrCp)_3$); a rare earth amidinate compounds (e.g., lanthanum tris-formamidinate $La(FAMD)_3$); a cyclooctadienyl compounds including a rare earth metal; an alkylamido compounds (e.g., tris (dimethylamido) cyclopentadienyl hafnium ($Hf(C_5H_5)(N(CH_3)_2)_3$), tris (dimethylamido) cyclopentadienyl zirconium ($Zr(C_5H_5)(N(CH_3)_2)_3$), tetrakis-ethyl-methylamino hafnium (TEMAHf); tetrakis-ethyl-methylamino zirconium (TEMAZr); tetrakis (diethylamino) hafnium ($(Et_2N)_4Hf$ or TDEAH); and/or tetrakis (dimethylamino) hafnium ($(Me_2N)_4Hf$ or TDMAH)); an alkoxide; a halide compound of silicon; a silicon tetrachloride; a $Si_2Cl_6$; a silicon tetrafluoride; a silicon tetraiodide; or any combination thereof.

In some embodiments, the first precursor gas comprises at least one of decaborane, hafnium tetrachloride, zirconium tetrachloride, indium trichloride, metalorganic β-diketonate complexes, tungsten hexafluoride, cyclopentadienylcycloheptatrienyl-titanium (CpTiCht), aluminum trichloride, titanium iodide, cyclooctatetraenecyclo-pentadienyltitanium, biscyclopentadienyltitaniumdiazide, trimethyl gallium, trimethyl indium, aluminum alkyls like trimethylaluminum, triethylaluminum, trimethylamine alane, dimethyl zinc, tetramethyl tin, trimethyl antimony, diethyl cadmium, tungsten carbony, or any combination thereof.

In some embodiments, the first precursor gas comprises at least one of elemental boron, copper, phosphorus, decaborane, gallium halides, indium halides, antimony halides, arsenic halides, gallium halides, aluminum iodide, titanium iodide, $MoO_2Cl_2$, $MoOCl_4$, $MoCl_5$, $WCl_5$, $WOCl_4$, $WCl_6$, cyclopentadienylcycloheptatrienyltitanium (CpTiCht), cyclooctatetraenecyclopenta-dienyltitanium, biscyclopentadienyltitanium-diazide, $In(CH_3)_2(hfac)$, dibromomethyl stibine, tungsten carbonyl, metalorganic β-diketonate complexes, metalorganic alkoxide complexes, metalorganic carboxylate complexes, metalorganic aryl complexes, metalorganic amido complexes, or any combination thereof. In some embodiments, the vaporizable precursor comprises, consists of, or consists essentially of at least one of $MoO_2Cl_2$, $MoOCl_4$, $WO_2Cl_2$, $WOCl_4$, or any combination thereof.

In some embodiments, the first precursor gas comprises at least one of decaborane, ($B_{10}H1_4$), pentaborane ($B_5H_9$), octadecaborane ($B1_8H_{22}$), boric acid ($H_3BO_3$), $SbCl_3$, $SbCl_5$, or any combination thereof. In some embodiments, the first precursor gas comprises at least one of $AsCl_3$, $AsBr_3$, $AsF_3$, $AsF_5$, $AsH_3$, $As_4O_6$, $As_2Se_3m$ $As_2S_2$, $As_2S_3$, $As_2S_5$, $As_2Te_3$, $B_4H_{11}$, $B_4H_{10}$, $B_3H_6N_3$, $BBr_3$, $BCl_3$, $BF_3$, $BF_3{\cdot}O(C_2H_5)_2$, $BF_3{\cdot}HOCH_3$, $B_2H_6$, $F_2$, HF, $GeBr_4$, $GeCl_4$, $GeF_4$, $GeH_4$, $H_2$, HCl, $H_2Se$, $H_2Te$, $H_2S$, $WF_6$, $SiH_4$, $SiH_2Cl_2$, $SiHCl_3$, $SiCl_4$, $SiH_3Cl$, $Si_2Cl_6$, $NH_3$, $NH_3$, Ar, $Br_2$, HBr, $BrF_5$, $CO_2$, CO, $COCl_2$, $COF_2$, $Cl_2$, $ClF_3$, $CF_4$, $C_2F_6$, $C_3F_8$, $C_4F_8$, $C_5F_8$, $CHF_3$, $CH_2F_2$, $CH_3F$, $CH_4$, $SiH_6$, He, HCN, Kr, Ne, $Ni(CO)_4$, $HNO_3$, NO, $N_2$, $NO_2$, $NF_3$, $N_2O$, $C_8H_{24}O_4Si_4$, $PH_3$, $POCl_3$, $PCl_5$, $PF_3$, PFS, $SbH_3$, $SO_2$, $SF_6$, $SF_4$, $Si(OC_2H_5)_4$, $C_4H1_6Si_4O_4$, $Si(CH_3)_4$, $SiH(CH_3)_3$, $TiCl_4$, Xe, $SiF_4$, $WOF_4$, $TaBr_5$, $TaCl_5$, $TaF_5$, $Sb(C_2H_5)_3$, $Sb(CH_3)_3$, $In(CH_3)_3$, $PBr_5$, $PBr_3$, $RuF_5$, or any combination thereof. It will be appreciated that other precursors may be used herein without departing from this disclosure. In some embodiments, the first precursor gas is a metal precursor.

In some embodiments, the method 100 for forming a film comprises flowing 104 a feed gas to an ozone generator to produce a second precursor gas. In some embodiments, the flowing 104 comprises supplying the feed gas to the ozone generator. In some embodiments, the flowing 104 comprises pumping the feed gas to the ozone generator. In some embodiments, the flowing 104 comprises introducing the feed gas into the ozone generator. In some embodiments, the flowing 104 comprises conveying the feed gas to the ozone generator. In some embodiments, the flowing 104 comprises drawing the feed gas, for example, under vacuum, into the ozone generator. In some embodiments, the flowing 104 comprises flowing the feed gas directly to the ozone generator to produce the second precursor gas. In some embodiments, the flowing 104 comprises flowing a first feed gas to the ozone generator and flowing a second feed gas to the ozone generator. In some embodiments, the first feed gas is different from the second feed gas. In some embodiments, the first feed gas comprises, for example, nitrogen and/or $N_2$. In some embodiments, the second feed gas comprises an oxidation gas. In some embodiments, the flowing 104 comprises flowing a single gas stream comprising the feed gas.

In some embodiments, the feed gas comprises at least 1% by volume of $N_2$ based on a total volume of the feed gas. In some embodiments, the feed gas comprises at least 2% by volume of $N_2$ based on a total volume of the feed gas. In some embodiments, the feed gas comprises at least 5% by volume of $N_2$ based on a total volume of the feed gas. In some embodiments, the feed gas comprises at least 10% by volume of $N_2$ based on a total volume of the feed gas. In some embodiments, the feed gas comprises at least 15% by volume of $N_2$ based on a total volume of the feed gas. In some embodiments, the feed gas comprises at least 20% by volume of $N_2$ based on a total volume of the feed gas. In some embodiments, the feed gas comprises at least 25% by volume of $N_2$ based on a total volume of the feed gas. In some embodiments, the feed gas comprises at least 30% by volume of $N_2$ based on a total volume of the feed gas. In some embodiments, the feed gas comprises at least 35% by volume of $N_2$ based on a total volume of the feed gas. In some embodiments, the feed gas comprises 1% to 40% by volume of $N_2$ based on the total volume of the feed gas, or any range or subrange between 1% and 40%. For example, in some embodiments, the feed gas comprises 1% to 40%, 1% to 35%, 1% to 30%, 1% to 25%, 1% to 20%, 1% to 15%, 1% to 10%, 1%, to 5%, 5%, to 40%, 10% to 40%, 15% to 40%, 20% to 40%, 25% to 40%, 30% to 40%, or 35% to 40% by weight of $N_2$ based on the total volume of the feed gas.

In some embodiments, the feed gas comprises at least 50% by volume of $O_2$ based on the total volume of the feed gas. In some embodiments, the feed gas comprises at least 60% by volume of $O_2$ based on the total volume of the feed gas. In some embodiments, the feed gas comprises at least 65% by volume of $O_2$ based on the total volume of the feed gas. In some embodiments, the feed gas comprises at least 70% by volume of $O_2$ based on the total volume of the feed gas. In some embodiments, the feed gas comprises at least 75% by volume of $O_2$ based on the total volume of the feed gas. In some embodiments, the feed gas comprises at least 80% by volume of $O_2$ based on the total volume of the feed gas. In some embodiments, the feed gas comprises at least 85% by volume of $O_2$ based on the total volume of the feed gas. In some embodiments, the feed gas comprises at least 90% by volume of $O_2$ based on the total volume of the feed gas. In some embodiments, the feed gas comprises 50% to 99% by volume of $O_2$ based on the total volume of the feed gas, or any range or subrange between 50% and 99%. For example, in some embodiments, the feed gas comprises 50% to 99%, 50% to 90%, 50% to 85%, 50% to 80%, 50% to 75%, 50% to 70%, 50% to 65%, 50% to 60%, 50% to 55%, 55% to 99%, 60% to 99%, 65% to 99%, 70% to 99%, 75% to 99%, 80% to 99%, 85% to 99%, or 90% to 99% by volume of $O_2$ based on the total volume of the feed gas.

In some embodiments, the feed gas comprises 0.1% to 20% by volume of $H_2$ based on the total volume of the feed gas, or any range or subrange between 0.1% and 20%. For example, in some embodiments, the feed gas comprises 0.1% to 19%, 0.1% to 18%, 0.1% to 17%, 0.1% to 16%, 0.1% to 15%, 0.1% to 14%, 0.1% to 13%, 0.1% to 12%, 0.1% to 11%, 0.1% to 10%, 0.1% to 9%, 0.1% to 8%, 0.1% to 7%, 0.1% to 6%, 0.1% to 5%, 0.1% to 4%, 0.1% to 3%, 0.1% to 2%, 0.1% to 1%, 0.1% to 0.9%, 0.1% to 0.8%, 0.1% to 0.7%, 0.1% to 0.6%, 0.1% to 0.5%, 0.1% to 0.4%, 0.1% to 0.3%, 0.1% to 0.2%, 1% to 20%, 2% to 20%, 3% to 20%, 4% to 20%, 5% to 20%, 6% to 20%, 7% to 20%, 8% to 20%, 9% to 20%, 10% to 20%, 11% to 20%, 12% to 20%, 13% to 20%, 14% to 20%, 15% to 20%, 16% to 20%, 17% to 20%, 18% to 20%, or 19% to 20%.

In some embodiments, the second precursor gas comprises ozone ($O_3$). In some embodiments, the second precursor gas further comprises at least one of elemental oxygen (O), oxygen ($O_2$), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), $NO_3$, or any combination thereof. In some embodiments, the second precursor gas comprises one or more of the first precursor gases.

In some embodiments, the method 100 for forming a film comprises exposing 106 the substrate to a second precursor gas to form a film on the substrate. In some embodiments, the exposing 106 comprises exposing the substrate to the second precursor gas to form, on the at least one structure of the substrate, a film. In some embodiments, the exposing 106 comprises introducing the second precursor gas into a chamber containing the substrate. In some embodiments, the exposing 106 comprises flowing the second precursor gas into a chamber containing the substrate. In some embodiments, the exposing 106 comprises supplying the second precursor gas to a chamber containing the substrate. In some embodiments, the exposing 106 comprises pumping the second precursor gas into a chamber containing the substrate. In some embodiments, the exposing 106 comprises pulsing the second precursor gas into a chamber containing the substrate. In some embodiments, the exposing 106 comprises pulsing the second precursor gas into a chamber containing the substrate for a duration. In some embodiments, the exposing 106 is sufficient to bring the second precursor gas and the substrate into immediate or close proximity, or direct physical contact.

In some embodiments, the exposing 106 comprises pulsing the second precursor gas into a chamber containing the substrate for a duration. In some embodiments, the duration is a duration of 0.01 seconds to 60 minutes, or longer, or any range or subrange between 0.01 second and 60 minutes. For example, in some embodiments, the duration is a duration of 0.01 seconds to 50 minutes, 0.01 seconds to 40 minutes, 0.01 seconds to 30 minutes, 0.01 seconds to 20 minutes, 0.01 seconds to 10 minutes, 0.01 seconds to 1 minute, 0.01 seconds to 45 seconds, 0.01 seconds to 30 seconds, 0.01 seconds to 15 seconds, 0.01 seconds to 10 seconds, 0.01 seconds to 5 seconds, 0.01 seconds to 3 seconds, 0.01 seconds to 1 seconds, 0.01 seconds to 0.5 seconds, 0.01 seconds to 0.1 seconds, or 0.01 seconds to 0.05 seconds. In some embodiments, the duration is a duration of 0.05 seconds to 60 minutes, 0.10 seconds to 60 minutes, 0.2 seconds to 60 minutes, 0.3 seconds to 60 minutes, 0.4 seconds to 60 minutes, 0.5 seconds to 60 minutes, 0.6 seconds to 60 minutes, 0.7 seconds to 60 minutes, 0.8 seconds to 60 minutes, 0.9 seconds to 60 minutes, 1 seconds to 60 minutes, 3 seconds to 60 minutes, 5 seconds to 60 minutes, 15 seconds to 60 minutes, 30 seconds to 60 minutes, 1 minute to 60 minutes, 10 minutes to 60 minutes, 20 minutes to 60 minutes, 30 minutes to 60 minutes, 40 minutes to 60 minutes, or 50 minutes to 60 minutes.

In some embodiments, the duration is a duration of 0.01 seconds to 5 minutes, or longer, or any range or subrange between 0.01 seconds and 5 minutes. For example, in some embodiments, the duration is a duration of 0.01 seconds to 4 minutes, 0.01 seconds to 3 minutes, 0.01 seconds to 2 minutes, 0.01 seconds to 2 minutes, 0.01 seconds to 1 minute, 0.01 seconds to 50 seconds, 0.01 seconds to 40 seconds, 0.01 seconds to 30 seconds, 0.01 seconds to 20 seconds, 0.01 seconds to 10 seconds, 0.01 seconds to 5 seconds, or 0.01 seconds to 3 seconds, 0.01 seconds to 1 seconds, 0.01 seconds to 0.5 seconds, 0.01 seconds to 0.1 seconds, or 0.01 seconds to 0.05 seconds. In some embodiments, the duration is a duration of 0.05 seconds to 5 minutes, 0.05 seconds to 5 minutes, 0.10 seconds to 5 minutes, 0.2 seconds to 5 minutes, 0.3 seconds to 5 minutes, 0.4 seconds to 5 minutes, 0.5 seconds to 5 minutes, 0.6 seconds to 5 minutes, 0.7 seconds to 5 minutes, 0.8 seconds to 5 minutes, 0.9 seconds to 5 minutes, 1 seconds to 5 minutes, 3 seconds to 5 minutes, 5 seconds to 5 minutes, 15 seconds to 5 minutes, 30 seconds to 5 minutes, 1 minute to 5 minutes, 2 minutes to 5 minutes, 3 minutes to 5 minutes, or 4 minutes to 5 minutes.

In some embodiments, the exposing 106 is performed at a temperature of 100° C. to 500° C., or any range or subrange between 100° C. and 500° C. For example, in some embodiments, the exposing 102 is performed at a temperature of 100° C. to 475° C., 100° C. to 450° C., 100° C. to 425° C., 100° C. to 400° C., 100° C. to 375° C., 100° C. to 350° C., 100° C. to 325° C., 100° C. to 300° C., 100° C. to 275° C., 100° C. to 250° C., 100° C. to 225° C., 100° C. to 200° C., 100° C. to 175° C., 100° C. to 150° C., 100° C. to 125° C., 125° C. to 500° C., 150° C. to 500° C., 175° C. to 500° C., 200° C. to 500° C., 225° C. to 500° C., 250° C. to 500° C., 275° C. to 500° C., 300° C. to 500° C., 325° C. to 500° C., 350° C. to 500° C., 375° C. to 500° C., 400° C. to 500° C., 425° C. to 500° C., 450° C. to 500° C., or 475° C. to 500° C.

In some embodiments, the resulting film has a step coverage of at least 90%. For example, in some embodiments, the film has a step coverage of at least 90%, at least 91%, at least 92%, at least 93%, at least 94%, at least 95%, at least 96%, at least 97%, at least 98%, at least 99%, or greater. In some embodiments, the film has a step coverage of 90% to 100%, or any range or subrange between 90% and 100%. For example, in some embodiments, the film has a step coverage of 90% to 99%, 90% to 98%, 90% to 97%, 90% to 96%, 90% to 95%, 90% to 94%, 90% to 93%, 90% to 92%, 90% to 91%, 91% to 100%, 92% to 100%, 93% to 100%, 94% to 100%, 95% to 100%, 96% to 100%, 97% to 100%, 98% to 100%, 99% to 100%, 91% to 99%, 92% to 99%, 93% to 99%, 94% to 99%, 95% to 99%, 96% to 99%, 97% to 99%, or 98% to 99%.

In some embodiments, the film comprises a metal oxide. In some embodiments, for example, the film comprises a hafnium oxide. In some embodiments, the film comprises a zirconium oxide. In some embodiments, the film comprises an aluminum oxide. In some embodiments, the film comprises a titanium oxide. In some embodiments, the film comprises a tantalum oxide. In some embodiments, the film comprises a niobium oxide. In some embodiments, the film comprises a vanadium oxide. In some embodiments, the film comprises a gallium oxide. In some embodiments, the film comprises an indium oxide. In some embodiments, the film comprises a silicon oxide.

The film may have a thickness of 1 nm to 5 μm, or any range or subrange between 1 nm and 5 μm. In some embodiments, for example, the film has a thickness of 1 nm to 4 μm, 1 nm to 3 μm, 1 nm to 2 μm, 1 nm to 1 μm, 1 nm to 900 nm, 1 nm to 800 nm, 1 nm to 700 nm, 1 nm to 600 nm, 1 nm to 500 nm, 1 nm to 400 nm, 1 nm to 300 nm, 1 nm to 200 nm, 1 nm to 100 nm, 100 nm to 5 μm, 200 nm to 5 μm, 300 nm to 5 μm, 400 nm to 5 μm, 500 nm to 5 μm, 600 nm to 5 μm, 700 nm to 5 μm, 800 nm to 5 μm, 900 nm to 5 μm, 1 μm to 5 μm, 2 μm to 5 μm, 3 μm to 5 μm, or 4 μm to 5 μm. In some embodiments, the film has a thickness of 0.1 nm to 10 nm, 0.1 m to 9 nm, 0.1 nm to 8 nm, 0.1 nm to 7 nm, 0.1 nm to 6 nm, or 0.1 nm to 5 nm.

The film may have a concentration of less than $1\times10^{20}$ hydrogen atoms per cubic centimeter as measured by Secondary Ion Mass Spectrometry (SIMS). For example, in some embodiments, the film may have a concentration of less than $1\times10^{20}$ hydrogen atoms per cubic centimeter, less than $0.9\times10^{20}$ hydrogen atoms per cubic centimeter, less than $0.8\times10^{20}$ hydrogen atoms per cubic centimeter, less than $0.7\times10^{20}$ hydrogen atoms per cubic centimeter, less than $0.6\times10^{20}$ hydrogen atoms per cubic centimeter, less than $0.5\times10^{20}$ hydrogen atoms per cubic centimeter, less than $0.4\times10^{20}$ hydrogen atoms per cubic centimeter, less than $0.3\times10^{20}$ hydrogen atoms per cubic centimeter, less than $0.2\times10^{20}$ hydrogen atoms per cubic centimeter, or less than $0.1\times10^{20}$ hydrogen atoms per cubic centimeter. In some embodiments, the film may have a concentration of less than $9\times10^{19}$ hydrogen atoms per cubic centimeter, less than $8\times10^{19}$ hydrogen atoms per cubic centimeter, less than $7\times10^{19}$ hydrogen atoms per cubic centimeter, less than $7\times10^{19}$ hydrogen atoms per cubic centimeter, less than $6\times10^{19}$ hydrogen atoms per cubic centimeter, less than $5\times10^{19}$ hydrogen atoms per cubic centimeter, less than $4\times10^{19}$ hydrogen atoms per cubic centimeter, less than $3\times10^{19}$ hydrogen atoms per cubic centimeter, less than $2\times10^{19}$ hydrogen atoms per cubic centimeter, or less than $1\times10^{19}$ hydrogen atoms per cubic centimeter as measured by SIMS.

The film may have a concentration of less than less than $10\times10^{18}$ carbon atoms per cubic centimeter as measured by SIMS. For example, in some embodiments, the film has a concentration of less than $10\times10^{18}$ carbon atoms per cubic centimeter, less than $9\times10^{18}$ carbon atoms per cubic centimeter, less than $8\times10^{18}$ carbon atoms per cubic centimeter, less than $7\times10^{18}$ carbon atoms per cubic centimeter, less than $6\times10^{18}$ carbon atoms per cubic centimeter, less than $5\times10^{18}$ carbon atoms per cubic centimeter, less than $4\times10^{18}$ carbon atoms per cubic centimeter, less than $3\times10^{18}$ carbon atoms per cubic centimeter, less than $2\times10^{18}$ carbon atoms per cubic centimeter, or less than $1\times10^{18}$ carbon atoms per cubic centimeter.

In some embodiments, the method 100 does not comprise flowing a feed gas to the ozone generator to produce an ozone component and/or flowing a $NO_x$ gas to combine with the ozone component to produce the second precursor gas.

Figure 2:
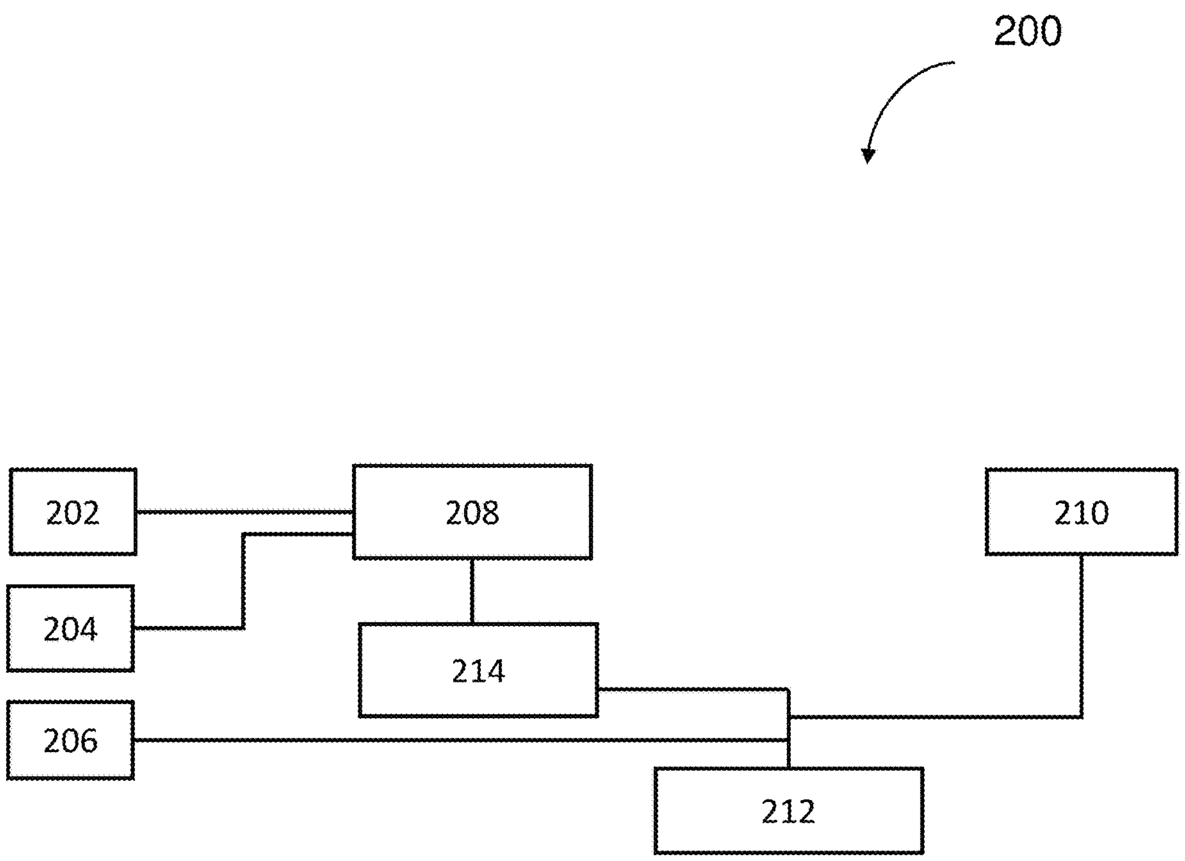
FIG. 2 is a block diagram of a system for a vapor deposition, according to some embodiments.

FIG. 2 is a block diagram of a system 200 for a vapor deposition, according to some embodiments. As shown in FIG. 2, in some embodiments, the system 200 comprises a feed gas comprising $O_2$ and $N_2$. In some embodiments, the $O_2$ is supplied from an oxygen source 202 and the $N_2$ is supplied from a nitrogen source 204. Although the $O_2$ and the $N_2$ are shown being supplied in separate gas streams, it will be appreciated that other configurations are possible, such as, for example and without limitation, the $O_2$ and the $N_2$ can be supplied in a single stream, or more than two streams, among other things. The $O_2$ from oxygen source 202 and the $N_2$ from nitrogen source 204 are flowed to an ozone generator 208 to produce a second precursor gas 214. In some embodiments, the second precursor 214 comprises ozone ($O_3$). In some embodiments, the system 200 comprises a metal precursor source 210 for supplying a metal precursor to a vapor deposition apparatus 212 (e.g., a chamber). In some embodiments, the system 200 comprises an inert source 206 for supplying an inert gas, such as, for example and without limitation, $N_2$ to the vapor deposition apparatus 212. At the vapor deposition apparatus 212, a vapor deposition process is conducted to form a film on, at least one structure of a substrate, on the substrate, wherein the film has a step coverage of at least 90%.

Some embodiments relate to a device, such as, for example and without limitation, a device useful in semiconductor applications and other microelectronics applications. In some embodiments, the device comprises any of the films disclosed herein. In some embodiments, for example, the device comprises a substrate having at least one structure with a high aspect ratio. In some embodiments, the device comprises a film located on at least the at least one structure with the high aspect ratio. In some embodiments, the film is located on the device with an improved step coverage. In some embodiments, the film directly contacts the substrate and/or the at least one structure.

In some embodiments, the device comprises a substrate. In some embodiments, the substrate is a high-aspect ratio substrate. For example, in some embodiments, a high-aspect ratio substrate comprises a substrate having at least one structure with a high aspect ratio. In some embodiments, the substrate can have a plurality of structures, wherein each of the plurality of structures has a high aspect ratio. The at least one structure is not particularly limited and can include any structure having a high aspect ratio as disclosed herein. In some embodiments, the at least one structure comprises at least one of a trench, a plenum, a cavity, a hole, a channel, or any combination thereof.

The at least one structure on the substrate may be a structure having an aspect ratio of at least 10:1. For example, in some embodiments, the substrate has at least one structure with an aspect ratio of at least 10:1, at least 20:1, at least 30:1, at least 40:1, at least 50:1, at least 60:1, at least 70:1, at least 80:1, or at least 90:1. In some embodiments, the substrate has at least one structure with an aspect ratio of 10:1 to 100:1, 10:1 to 90:1, 10:1 to 80:1, 10:1 to 70:1, 10:1 to 60:1, 10:1 to 50:1, 10:1 to 40:1, 10:1 to 30:1, 10:1 to 20:1, 20:1 to 100:1, 30:1 to 100:1, 40:1 to 100:1, 50:1 to 100:1, 60:1 to 100:1, 70:1 to 100:1, 80:1 to 100:1, or 90:1 to 100:1. In some embodiments, the at least one structure and the substrate are a single unitary piece. In some embodiments, the at least one structure and the substrate are separately manufactured and assembled together.

The substrate may comprise a surface upon which a film is formed as disclosed herein. In some embodiments, the substrate comprises at least one of a silicon, a silicon oxide, a silicon on insulator (SOI), a carbon doped silicon oxide, a silicon nitride, a doped silicon, a germanium, a gallium arsenide, a glass, a sapphire, a metal, a metal nitride, a metal alloy, or any combination thereof.

In some embodiments, the device comprises a film located on the substrate. In some embodiments, the film directly contacts the substrate. In some embodiments, the film is located on the at least one structure. In some embodiments, the film directly contacts a surface(s) of the at least one structure. In some embodiments, the film is located on the at least one structure with a step coverage of at least 90%. In some embodiments, for example, the film is located on the at least one structure with a step coverage of at least 90%, at least 91%, at least 92%, at least 93%, at least 94%, at least 95%, at least 96%, at least 97%, at least 98%, or at least 99%. In some embodiments, the film is located on the at least one structure with a step coverage of 90% to 100%, 90% to 99%, 90% to 98%, 90% to 97%, 90% to 96%, 90% to 95%, 90% to 94%, 90% to 93%, 90% to 92%, 90% to 91%, 91% to 100%, 92% to 100%, 93% to 100%, 94% to 100%, 95% to 100%, 96% to 100%, 97% to 100%, 98% to 100%, 99% to 100%, or any range or subrange between 90% and 100%.

In some embodiments, the film comprises a metal oxide. In some embodiments, for example, the film comprises a hafnium oxide. In some embodiments, the film comprises a zirconium oxide. In some embodiments, the film comprises an aluminum oxide. In some embodiments, the film comprises a titanium oxide. In some embodiments, the film comprises a tantalum oxide. In some embodiments, the film comprises a niobium oxide. In some embodiments, the film comprises a vanadium oxide. In some embodiments, the film comprises a gallium oxide. In some embodiments, the film comprises an indium oxide. In some embodiments, the film comprises a silicon oxide.

The film may have a thickness of 5 nm to 5 μm, or any range or subrange between 5 nm and 5 μm. In some embodiments, for example, the film has a thickness of 5 nm to 4 μm, 5 nm to 3 μm, 5 nm to 2 μm, 5 nm to 1 μm, 5 nm to 900 nm, 5 nm to 800 nm, 5 nm to 700 nm, 5 nm to 600 nm, 5 nm to 500 nm, 5 nm to 400 nm, 5 nm to 300 nm, 5 nm to 200 nm, 5 nm to 100 nm, 100 nm to 5 μm, 200 nm to 5 μm, 300 nm to 5 μm, 400 nm to 5 μm, 500 nm to 5 μm, 600 nm to 5 μm, 700 nm to 5 μm, 800 nm to 5 μm, 900 nm to 5 μm, 1 μm to 5 μm, 2 μm to 5 μm, 3 μm to 5 μm, or 4 μm to 5 μm.

The film may have a concentration of less than $1\times10^{20}$ hydrogen atoms per cubic centimeter as measured by Secondary Ion Mass Spectrometry (SIMS). For example, in some embodiments, the film may have a concentration of less than $1\times10^{20}$ hydrogen atoms per cubic centimeter, less than $0.9\times10^{20}$ hydrogen atoms per cubic centimeter, less than $0.8\times10^{20}$ hydrogen atoms per cubic centimeter, less than $0.7\times10^{20}$ hydrogen atoms per cubic centimeter, less than $0.6\times10^{20}$ hydrogen atoms per cubic centimeter, less than $0.5\times10^{20}$ hydrogen atoms per cubic centimeter, less than $0.4\times10^{20}$ hydrogen atoms per cubic centimeter, less than $0.3\times10^{20}$ hydrogen atoms per cubic centimeter, less than $0.2\times10^{20}$ hydrogen atoms per cubic centimeter, or less than $0.1\times10^{20}$ hydrogen atoms per cubic centimeter. In some embodiments, the film may have a concentration of less than $9\times10^{19}$ hydrogen atoms per cubic centimeter, less than $8\times10^{19}$ hydrogen atoms per cubic centimeter, less than $7\times10^{19}$ hydrogen atoms per cubic centimeter, less than $7\times10^{19}$ hydrogen atoms per cubic centimeter, less than $6\times10^{19}$ hydrogen atoms per cubic centimeter, less than $5\times10^{19}$ hydrogen atoms per cubic centimeter, less than $4\times10^{19}$ hydrogen atoms per cubic centimeter, less than $3\times10^{19}$ hydrogen atoms per cubic centimeter, less than $2\times10^{19}$ hydrogen atoms per cubic centimeter, or less than $1\times10^{19}$ hydrogen atoms per cubic centimeter as measured by SIMS.

The film may have a concentration of less than $10\times10^{18}$ carbon atoms per cubic centimeter as measured by SIMS. For example, in some embodiments, the film has a concentration of less than $10\times10^{18}$ carbon atoms per cubic centimeter, less than $9\times10^{18}$ carbon atoms per cubic centimeter, less than $8\times10^{18}$ carbon atoms per cubic centimeter, less than $7\times10^{18}$ carbon atoms per cubic centimeter, less than $6\times10^{18}$ carbon atoms per cubic centimeter, less than $5\times10^{18}$ carbon atoms per cubic centimeter, less than $4\times10^{18}$ carbon atoms per cubic centimeter, less than $3\times10^{18}$ carbon atoms per cubic centimeter, less than $2\times10^{18}$ carbon atoms per cubic centimeter, or less than $1\times10^{18}$ carbon atoms per cubic centimeter.

Example 1

Various aluminum oxide films were deposited on substrates having high-aspect ratio structures by an atomic layer deposition process. The deposition process involved 100 to 200 cycles in which the substrate was exposed to $AlCl_3$ and an oxidation gas. Each sample involved a substrate having a trench structure with an aspect ratio of 11:1. Each sample was exposed to the $AlCl_3$ and co-reactant gas at a temperature of 250° C. Each sample had a different co-reactant gas. Sample 1 used water as the co-reactant. Sample 2 used ozone as the co-reactant. In Sample 2, 100 ppm of $N_2$ in $O_2$ flowed into a corona discharge ozone generator (MKS O3Mega AX8561) at 2 slm with a power of 50%. Sample 3 used ozone produced from a mixture of 20% $N_2$ and 80% $O_2$ with a power of 39%. The ozone generator had a maximum power of 1750 Watts. The growth per cycle (GPC, in Angstroms/Cycle), step coverage over the trench structure, and impurity level were measured. The results are summarized in Tables 1 and 2 below.

TABLE 1

| | Co-reactant | Ozone generator power | GPC (Angstroms/ Cycle) | Step Coverage (%) |
|---|---|---|---|---|
| Sample 1 | $H_2O$ | 0 | 0.9 | 98 |
| Sample 2 | 100 ppm $N_2$ in $O_2$ | 50% | 1.1 | 73 |
| Sample 3 | 20% $N_2/O_2$ | 39% | 1.5 | 100 |

TABLE 2

| | SIMS Impurity (atom/cc) | | | |
|---|---|---|---|---|
| | C | Cl | H | N |
| Sample 1 | 7.0E18 | 3.0E21 | 1.4E22 | 4.8E17 |
| Sample 2 | 6.0E18 | 2.5E21 | 1.0E20 | 5.0E18 |
| Sample 3 | 2.5E18 | 7.6E21 | 4.5E19 | 6.6E20 |

As shown above, the step coverage for the aluminum oxide film in Sample 3 unexpectedly improved when a mixture of 20% $N_2$ and 80% $O_2$ was supplied to the ozone generator and the substrate was exposed to the ozone-containing gas from the ozone generator. Using this process, low C and low $H_2$ levels were measured in the resulting film in Sample 3, relative to the other samples. In addition, Sample 3 exhibited improved growth per cycle relative to the other samples.

ASPECTS

Various Aspects are described below. It is to be understood that any one or more of the features recited in the following Aspect(s) can be combined with any one or more other Aspect(s).

Aspect 1. A device comprising:
- a substrate having at least one structure with an aspect ratio of at least 10:1; and
- a film located on the at least one structure with a step coverage of at least 90%;
  - wherein the film comprises:
    - a metal oxide or metalloid oxide; and
    - a concentration of less than $1\times10^{20}$ hydrogen atoms per cubic centimeter as measured by SIMS.

Aspect 2. The device according to Aspect 1, wherein the substrate comprises at least one of a silicon, a silicon oxide, a silicon on insulator (SOI), a carbon doped silicon oxide, a silicon nitride, a doped silicon, a germanium, a gallium arsenide, a glass, a sapphire, a metal, a metal nitride, a metal alloy, or any combination thereof.

Aspect 3. The device according to any one of Aspects 1-2, wherein the at least one structure is defined by the substrate and comprises at least one of a trench, a plenum, a cavity, a hole, a channel, or any combination thereof.

Aspect 4. The device according to any one of Aspects 1-3, wherein the aspect ratio of the at least one structure is 10:1 to 100:1.

Aspect 5. The device according to any one of Aspects 1-4, wherein the film directly contacts a surface of the at least one structure.

Aspect 6. The device according to any one of Aspects 1-5, wherein the film comprises at least one of a hafnium oxide, a zirconium oxide, an aluminum oxide, a titanium oxide, a tantalum oxide, a niobium oxide, a vanadium oxide, a gallium oxide, an indium oxide, silicon oxide, or any combination thereof.

Aspect 7. The device according to any one of Aspects 1-6, wherein the film has a thickness of 1 nm to 5 μm.

Aspect 8. The device according to any one of Aspects 1-7, wherein the film has a thickness of 1 nm to 500 nm.

Aspect 9. The device according to any one of Aspects 1-8, wherein the film comprises less than $10\times10^{18}$ carbon atoms per cubic centimeter as measured by SIMS.

Aspect 10. A method comprising:
- exposing a substrate having at least one structure with an aspect ratio of at least 10:1, to a first precursor gas;
- flowing a feed gas comprising at least 1% by volume of $N_2$ based on a total volume of the feed gas, to an ozone generator to produce a second precursor gas;
- exposing the substrate to the second precursor gas to form, on the at least one structure of the substrate, a film having a step coverage of at least 90%.

Aspect 11. The method according to Aspect 10, wherein the substrate comprises at least one of a silicon, a silicon oxide, a silicon on insulator (SOI), a carbon doped silicon oxide, a silicon nitride, a doped silicon, a germanium, a gallium arsenide, a glass, a sapphire, a metal, a metal nitride, a metal alloy, or any combination thereof.

Aspect 12. The method according to any one of Aspects 10-11, wherein the at least one structure is defined by the substrate and comprises at least one of a trench, a plenum, a cavity, a hole, a channel, or any combination thereof.

Aspect 13. The method according to any one of Aspects 10-12, wherein the aspect ratio of the at least one structure is 10:1 to 100:1.

Aspect 14. The method according to any one of Aspects 10-13, wherein the first precursor gas comprises at least one of $SiCl_4$, hexachlorodisilane, $HfCl_4$, $ZrCl_4$, $AlCl_3$, trimethyl aluminum, $TiCl_4$, $TaCl_5$, $NbCl_5$, $VCl_4$, $GaCl_3$, $InCl_3$, tris (dimethylamido) cyclopentadienyl hafnium, tris (dimethylamido) cyclopentadienyl zirconium, tetrakis-ethyl-methylamino hafnium; tetrakis-ethyl-methylamino zirconium; tetrakis (diethylamino) hafnium; tetrakis (dimethylamino) hafnium, or any combination thereof.

Aspect 15. The method according to any one of Aspects 10-14, wherein the feed gas comprises:
- 2% to 40% by volume of $N_2$ based on a total volume of the feed gas; and
- 60% to 98% by volume of $O_2$ based on the total volume of the feed gas.

Aspect 16. The method according to any one of Aspects 10-15, wherein the feed gas comprises:
- 10% to 30% by volume of $N_2$ based on a total volume of the feed gas; and
- 70% to 90% by volume of $O_2$ based on the total volume of the feed gas.

Aspect 17. The method according to any one of Aspects 10-16, wherein the second precursor gas comprises ozone ($O_3$).

Aspect 18. The method according to any one of Aspects 10-17, wherein the second precursor gas further comprises at least one of oxygen ($O_2$), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), or any combination thereof.

Aspect 19. The method according to any one of Aspects 10-18, wherein the film comprises:

a metal oxide or metalloid oxide; and a concentration of less than $1\times10^{20}$ hydrogen atoms per cubic centimeter as measured by SIMS.

Aspect 20. The method according to any one of Aspects 10-19, wherein the film comprises at least one of a hafnium oxide, a zirconium oxide, an aluminum oxide, a titanium oxide, a tantalum oxide, a niobium oxide, a vanadium oxide, a gallium oxide, an indium oxide, a silicon oxide, or any combination thereof.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A method comprising:

exposing a substrate having at least one structure with an aspect ratio of at least 10:1, to a first precursor gas;

flowing a feed gas comprising at least 1% by volume of $N_2$ based on a total volume of the feed gas, to an ozone generator to produce a second precursor gas; and exposing the substrate to the second precursor gas to form, on the at least one structure of the substrate, a film having a step coverage of at least 90% and wherein the film has increased step coverage compared to a similar film produced under the same conditions using a feed gas comprising $O_2$ and less than 1% by volume of $N_2$.

2. The method of claim 1, wherein the substrate comprises at least one of a silicon, a silicon oxide, a silicon on insulator (SOI), a carbon doped silicon oxide, a silicon nitride, a doped silicon, a germanium, a gallium arsenide, a glass, a sapphire, a metal, a metal nitride, a metal alloy, or any combination thereof.

3. The method of claim 1, wherein the at least one structure is defined by the substrate and comprises at least one of a trench, a plenum, a cavity, a hole, a channel, or any combination thereof.

4. The method of claim 1, wherein the aspect ratio of the at least one structure is 10:1 to 100:1.

5. The method of claim 1, wherein the first precursor gas comprises at least one of $SiCl_4$, hexachlorodisilane, $HfCl_4$, $ZrCl_4$, $AlCl_3$, trimethyl aluminum, $TiCl_4$, $TaCl_5$, $NbCl_5$, $VCl_4$, $GaCl_3$, $InCl_3$, tris (dimethylamido) cyclopentadienyl hafnium, tris (dimethylamido) cyclopentadienyl zirconium, tetrakis-ethyl-methylamino hafnium; tetrakis-ethyl-methylamino zirconium; tetrakis (diethylamino) hafnium; tetrakis (dimethylamino) hafnium, or any combination thereof.

6. The method of claim 1, wherein the feed gas comprises:

2% to 40% by volume of $N_2$ based on a total volume of the feed gas; and

60% to 98% by volume of $O_2$ based on the total volume of the feed gas.

7. The method of claim 1, wherein the feed gas comprises:

10% to 30% by volume of $N_2$ based on a total volume of the feed gas; and

70% to 90% by volume of $O_2$ based on the total volume of the feed gas.

8. The method of claim 1, wherein the second precursor gas comprises ozone ($O_3$).

9. The method of claim 1, wherein the second precursor gas further comprises at least one of oxygen ($O_2$), water ($H_2O$), hydrogen peroxide ($H_2O_2$), nitrous oxide ($N_2O$), nitric oxide (NO), dinitrogen pentoxide ($N_2O_5$), nitrogen dioxide ($NO_2$), or any combination thereof.

10. The method of claim 1, wherein the film comprises:

a metal oxide; and a concentration of less than $1\times10^{20}$ hydrogen atoms per cubic centimeter as measured by Secondary Ion Mass Spectroscopy (SIMS).

11. The method of claim 1, wherein the film comprises at least one of a hafnium oxide, a zirconium oxide, an aluminum oxide, a titanium oxide, a tantalum oxide, a niobium oxide, a vanadium oxide, a gallium oxide, an indium oxide, or any combination thereof.

12. The method of claim 1, wherein use of the feed gas comprising $O_2$ and at least 1% by volume of $N_2$ improves step coverage of the film over use of a feed gas comprising $O_2$ and less than 1% by volume of $N_2$.

* * * * *